(12) United States Patent
Park et al.

(10) Patent No.: US 12,707,952 B2
(45) Date of Patent: Aug. 11, 2026

(54) SEMICONDUCTOR DEVICE INCLUDING BSPDN STRUCTURES IN SMALL-CPP AREA AND LARGE-CPP AREA

(71) Applicant: SAMSUNG ELECTRONICS CO., LTD., Suwon-si (KR)

(72) Inventors: Panjae Park, Halfmoon, NY (US); Kang-ill Seo, Springfield, VA (US)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 392 days.

(21) Appl. No.: 18/220,432

(22) Filed: Jul. 11, 2023

(65) Prior Publication Data

US 2024/0290690 A1 Aug. 29, 2024

Related U.S. Application Data

(60) Provisional application No. 63/448,143, filed on Feb. 24, 2023.

(51) Int. Cl.
*H10W 20/20* (2026.01)
*H10D 30/43* (2025.01)
(Continued)

(52) U.S. Cl.
CPC ............ *H10W 20/20* (2026.01); *H10D 30/43* (2025.01); *H10D 30/6729* (2025.01);
(Continued)

(58) Field of Classification Search
CPC ............... H10D 30/43; H10D 30/6729; H10D 30/6735; H10D 30/6757; H10D 62/121; H10D 64/258
See application file for complete search history.

(56) References Cited

U.S. PATENT DOCUMENTS

| | | | |
|---|---|---|---|
| 11,450,665 B2 | 9/2022 | Chiang et al. | |
| 2021/0098294 A1* | 4/2021 | Smith | H10D 84/038 |

(Continued)

*Primary Examiner* — Jeff W Natalini
*Assistant Examiner* — Rose Keagy
(74) *Attorney, Agent, or Firm* — Myers Bigel, P.A.

(57) ABSTRACT

Provided is a semiconductor device in which a large-CPP area includes a 1st source/drain structure; a 1st frontside contact structure, at a front side of the semiconductor device, connected to the 1st source/drain structure; a 1st via structure, at a lateral side of the 1st source/drain structure, connected to the 1st frontside contact structure; a 2nd via structure on the 1st frontside via structure; a 1st frontside metal line, at the front side of the semiconductor device, connected to the 2nd via structure; and a 1st backside metal line, at a back side of the semiconductor device, connected to the 1st via structure.

20 Claims, 4 Drawing Sheets

(51) Int. Cl.
*H10D 30/67* (2025.01)
*H10D 62/10* (2025.01)
*H10D 64/23* (2025.01)

(52) U.S. Cl.
CPC ..... *H10D 30/6735* (2025.01); *H10D 30/6757* (2025.01); *H10D 62/121* (2025.01); *H10D 64/258* (2025.01)

(56) References Cited

U.S. PATENT DOCUMENTS

| | | | |
|---|---|---|---|
| 2021/0375853 | A1* | 12/2021 | Chen ...................... H10D 89/10 |
| 2022/0093489 | A1 | 3/2022 | Do et al. |
| 2022/0123023 | A1 | 4/2022 | Peng et al. |
| 2022/0181258 | A1 | 6/2022 | Liebmann et al. |
| 2022/0320093 | A1 | 10/2022 | Peng et al. |
| 2022/0336325 | A1 | 10/2022 | Lai et al. |
| 2022/0344255 | A1 | 10/2022 | Lai et al. |
| 2023/0008866 | A1* | 1/2023 | Lai ......................... H10D 89/10 |
| 2023/0036522 | A1* | 2/2023 | Chen .................. H10D 84/0149 |

* cited by examiner 20 (A2)

230: LSD3, USD3
231: SV2 – V4

D3 D2 D1

20 (A1)

210: LSD1, USD1
211: SV1 – V1
220: LSD2, USD2
221: BC1 – LSD2 – V2 – V3

SEMICONDUCTOR DEVICE INCLUDING BSPDN STRUCTURES IN SMALL-CPP AREA AND LARGE-CPP AREA

CROSS-REFERENCE TO RELATED APPLICATION

This application is based on and claims priority from U.S. Provisional Application No. 63/448,143 filed on Feb. 24, 2023 in the U.S. Patent and Trademark Office, the disclosure of which is incorporated herein in its entirety by reference.

BACKGROUND

1. Field

Apparatuses and methods consistent with example embodiments of the disclosure relate to a semiconductor device formed based on a backside power distribution network (BSPDN) structure.

2. Description of Related Art

A backside power distribution network (BSPDN) structure which is formed at a back side of a semiconductor device includes, for example, a backside contact structure and a backside metal line. The backside contact structure may contact a bottom surface of a source/drain structure of a transistor structure in the semiconductor device to connect the source/drain structure to a circuit element or a voltage source through the backside metal line, which may be a backside power rail.

In the related-art, the BSPDN structure is formed to support an area in a semiconductor device or a semiconductor cell where a contact-poly pitch (CPP) or a gate pitch is relatively small or fine (referred to as a small-CPP area herebelow). Thus, the BSPDN structure can address a routing complexity at a front side of this small gate-pitch area in the semiconductor device during a back-end-of-line (BEOL) process of manufacturing the semiconductor device. Further, the BSPDN structure can achieve an area gain for the semiconductor device and prevent an excessive IR drop at the front side of the semiconductor device at least because the backside contact structure is connected to a bottom surface of a source/drain structure of the semiconductor device. In contrast, in an area in the semiconductor device where the CPP is relatively large or less fine (referred to as a large-CPP area herebelow), a conventional frontside power distribution network (FSPDN) is used at least because the front side of the semiconductor device in the large-CPP area provides a relatively large space for formation of semiconductor elements such as active regions, contact structures, metal lines, etc.

Herein, the front side of a semiconductor device may include front-end-of-line (FEOL) elements such as a source/drain structure, middle-of-line (MOL) elements such as a source/drain contact structure and an MOL via structure, and BEOL elements such as a BEOL metal line.

Information disclosed in this Background section has already been known to the inventors before achieving the embodiments of the present application or is technical information acquired in the process of achieving the embodiments described herein. Therefore, it may contain information that does not form prior art that is already known to the public.

SUMMARY

Various example embodiments provide a semiconductor device in which a BSPDN structure is formed at a back side of each a small-CPP area and a large CPP area, thereby achieving an area gain and an improved device performance.

According to embodiments, there is provided a semiconductor device in which a small-CPP area may include: a 1st source/drain structure; a 1st frontside contact structure, at a front side of the semiconductor device, connected to the 1st source/drain structure; a 1st via structure on the 1st frontside contact structure; a 1st frontside metal line, at the front side of the semiconductor device, connected to the 1st via structure; a 1st backside contact structure, at a back side of the semiconductor device, connected to the 1st source/drain structure; and a 1st backside metal line, at the back side of the semiconductor device, connected to the 1st backside contact structure.

According to embodiments, the semiconductor device may also include a large-CPP area which may include: a 2nd source/drain structure; a 2nd frontside contact structure, at the front side of the semiconductor device, connected to the 2nd source/drain structure; a 2nd via structure, at a lateral side of the 2nd source/drain structure, connected to the 2nd frontside contact structure; a 3rd via structure on the 2nd via structure; a 2nd frontside metal line, at the front side of the semiconductor device, connected to the 3rd via structure; and a 2nd backside metal line, at the back side of the semiconductor device, connected to the 2nd via structure.

According to embodiments, there is provided a semiconductor device in which a small-CPP area may include: a lower source/drain structure; an upper source/drain structure above the lower source/drain structure; a 1st via structure on the 1st lower source/drain structure; a 2nd via structure on the 1st via structure; a frontside metal line, at a front side of the semiconductor device, connected to the 2nd via structure; a backside contact structure, at a back side of the semiconductor device, connected to the lower source/drain structure; and a backside metal line, at the back side of the semiconductor device, connected to the backside contact structure.

According to an embodiment, the small-CPP area may further include: an upper contact structure on the upper source/drain structure.

BRIEF DESCRIPTION OF DRAWINGS

Example embodiments of the disclosure will be more clearly understood from the following detailed description taken in conjunction with the accompanying drawings in which.

DETAILED DESCRIPTION OF EMBODIMENTS

Figure 1A:
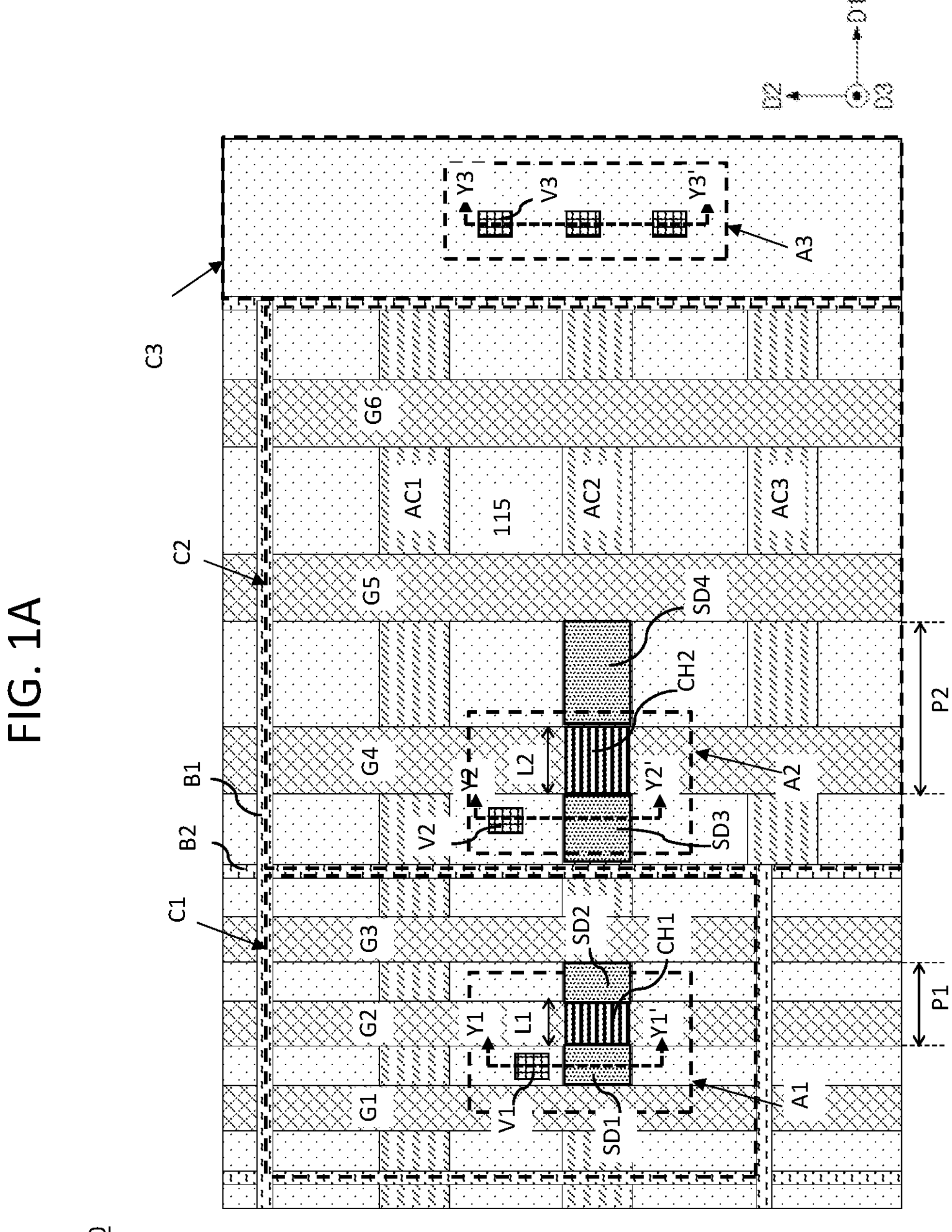
FIGS. 1A to 1D illustrate a semiconductor device in which a BSPDN structure is formed at a back side of each of a small-CPP area, a large-CPP area and a non-CPP area, according to embodiments.

The embodiments of the disclosure described herein are example embodiments, and thus, the disclosure is not limited thereto, and may be realized in various other forms. Each of the embodiments provided herein is not excluded from being associated with one or more features of another example or another embodiment also provided herein or not provided herein but consistent with the disclosure. For example, even if matters described in a specific example or embodiment are not described in a different example or embodiment thereto, the matters may be understood as being related to or combined with the different example or embodiment, unless otherwise mentioned in descriptions thereof. In addition, it is to be understood that all descriptions of principles, aspects, examples, and embodiments of the disclosure are intended to encompass structural and functional equivalents thereof. In addition, these equivalents should be understood as including not only currently well-known equivalents but also equivalents to be developed in the future, that is, all devices invented to perform the same functions regardless of the structures thereof.

It is to be understood that when an element, component, layer, pattern, structure, region, or so on (hereinafter collectively "element") of a semiconductor device is referred to as being "over," "above," "on," "below," "under," "beneath," "connected to" or "coupled to" another element the semiconductor device, it can be directly over, above, on, below, under, beneath, connected or coupled to the other element or an intervening element(s) may be present. In contrast, when an element of a semiconductor device is referred to as being "directly over," "directly above," "directly on," "directly below," "directly under," "directly beneath," "directly connected to" or "directly coupled to" another element of the semiconductor device, there are no intervening elements present. Like numerals refer to like elements throughout this disclosure.

Spatially relative terms, such as "over," "above," "on," "upper," "below," "under," "beneath," "lower," "left," "right," "lower-left," "lower-right," "upper-left," "upper-right," "central," "middle," and the like, may be used herein for ease of description to describe one element's relationship to another element(s) as illustrated in the drawings. It is to be understood that the spatially relative terms are intended to encompass different orientations of a semiconductor device in use or operation in addition to the orientation depicted in the drawings. For example, if the semiconductor device in the drawings is turned over, elements described as "below" or "beneath" other elements would then be oriented "above" the other elements. Thus, the term "below" can encompass both an orientation of above and below. The semiconductor device may be otherwise oriented (rotated 90 degrees or at other orientations) and the spatially relative descriptors used herein interpreted accordingly. As another example, when elements referred to as a "lower" element and an "upper" element" may be an "upper" element and a "lower" element when a device or structure including these elements are differently oriented. Thus, in the descriptions herebelow, the "lower" element and the "upper" element may also be referred to as a "$1^{st}$" element or a "$2^{nd}$" element, respectively, as long as their structural relationship is clearly understood in the context of the descriptions. Similarly, the terms a "left" element and a "right" element may be respectively referred to as a "$1^{st}$" element and a "$2^{nd}$" element with necessary descriptions to distinguish the two elements.

It is to be understood that, although the terms "$1^{st}$," "$2^{nd}$" "$3^{rd}$", "$4^{th}$", "$5^{th}$", "$6^{th}$", etc. may be used herein to describe various elements, these elements should not be limited by these terms. These terms are only used to distinguish one element from another element. Thus, a $1^{st}$ element described in one embodiment herein could be termed a $2^{nd}$ element in another embodiment or claims of the disclosure without departing from the teachings of the disclosure.

As used herein, expressions such as "at least one of," when preceding a list of elements, modify the entire list of elements and do not modify the individual elements of the list. For example, the expression, "at least one of a, b and c," should be understood as including only a, only b, only c, both a and b, both a and c, both b and c, or all of a, b and c. Herein, when a term "same" is used to compare a dimension of two or more elements, the term may cover a "substantially same" dimension.

It is to be understood that various elements shown in the drawings are schematic illustrations not drawn to scale. In addition, for ease of explanation, one or more elements of a type commonly used to form semiconductor devices may not be explicitly shown in the drawings without implying these elements are omitted from actual semiconductor devices. Furthermore, it is to be understood that the embodiments described herein are not limited to particular materials, features, and manufacturing steps or operations shown or described herein. Thus, with respect to semiconductor manufacturing steps, the descriptions provided herein are not intended to include all steps that may be required to form an actual semiconductor device. For example, the commonly-used steps such as planarizing, cleaning, or annealing steps may not be described herein for the sake of brevity. It is to be also understood that, even if a certain step or operation is described later than another step or operation, the step or operation may be performed later than the other step or operation unless the other step or operation is described as being performed after the step or operation.

Many embodiments are described herein with reference to cross-sectional views that are schematic illustrations of the embodiments. As such, variations from the shapes of the illustrations as a result, for example, of manufacturing techniques and/or tolerances, are to be expected. Thus, the embodiments should not be construed as limited to the particular shapes of elements illustrated herein but are to include deviations in shapes that result, for example, from manufacturing. Various elements illustrated in the drawings are schematic in nature and their shapes are not intended to illustrate the actual shape of an element of a semiconductor device and are not intended to limit the scope of the disclosure. Moreover, conventional elements of a semiconductor device and their functions, materials and shapes may not be described when these elements are not related to the novel features of the embodiments or not necessary in describing the same.

Herebelow, various embodiments of the disclosure will be described in reference to FIGS. 1A-1D to 3.

FIGS. 1A to 1D illustrate a semiconductor device in which a BSPDN structure is formed at a back side of each of a small-CPP area, a large-CPP area and a non-CPP area, according to embodiments.

Figure 1D:
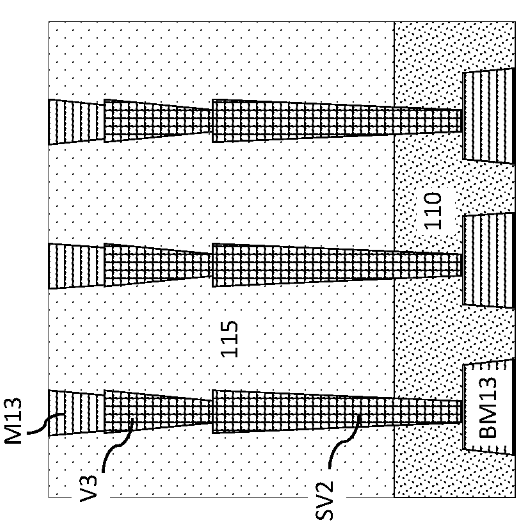
Figure 1C:
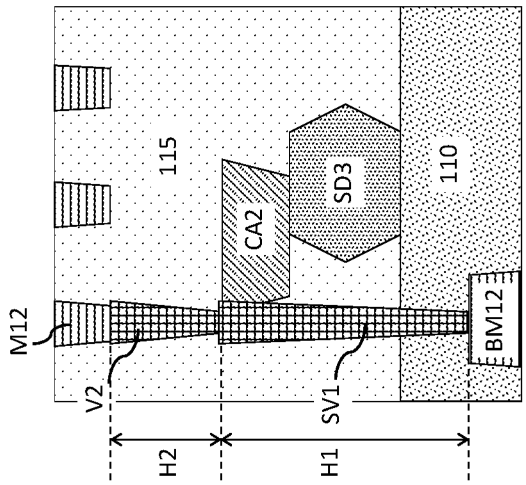
Figure 1B:
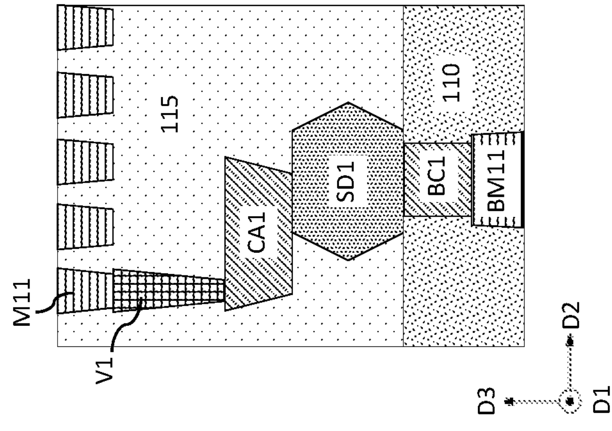

FIG. 1A is a top plan view of a semiconductor device, and FIGS. 1B-1D are cross-section views of the semiconductor device of FIG. 1 taken along lines Y1-Y1', Y2-Y2' and Y3-Y3' shown in FIG. 1A. It is to be understood that FIG. 1A is provided to help understanding of a positional relationship between a gate structure, a source/drain structure (region) and a via structure of a semiconductor device, and thus, some elements shown in FIGS. 1B-1D such as contact structures, metal line structures and isolation structures are not shown for drawing brevity purposes.

Referring to FIG. 1A, a semiconductor device 10 may include a plurality of cells including a $1^{st}$ cell C1, a $2^{nd}$ cell C2 and a $3^{rd}$ cell C3 which are isolated from each other by a gate-cut structure B1 and a fin-cut structure B2 as boundaries between the cells C1-C3.

The $1^{st}$ cell C1 may include $1^{st}$ to $3^{rd}$ gate structures G1-G3 arranged in the $1^{st}$ direction D1 at a gate pitch (i.e., CPP) P1 and extended in the $2^{nd}$ direction D2 across $1^{st}$ and $2^{nd}$ active regions AC1 and AC2, and the $2^{nd}$ cell C2 may include $4^{th}$ to $6^{th}$ gate structures G4-G6 arranged in the $1^{st}$ direction D1 at a gate pitch P2 and extended in the $2^{nd}$ direction D2 across the $1^{st}$ and $2^{nd}$ regions AC1, AC2 and a third active region AC3.

Herein, the $1^{st}$ direction D1 may be a channel-length direction in which a current flows between source/drain structures of a field-effect transistor such as a nanosheet transistor and a fin field-effect transistor (FinFET), and the $2^{nd}$ direction D2 may be a channel-width direction, intersecting or perpendicular to the $1^{st}$ direction D1.

The gate pitch P2 in the $2^{nd}$ cell C2 may be greater than the gate pitch P1 in the $1^{st}$ cell C1. Further, each of the gate structures G4-G6 in the $2^{nd}$ cell C2 may have a gate length L2 in the $2^{nd}$ direction D2, which is greater than a gate length L1 of each of the gate structures G1-G3 in the $1^{st}$ cell C1. Thus, the $1^{st}$ cell C1 and the $2^{nd}$ cell C2 may be referred to as a small-CPP cell and a large-CPP cell, respectively. In contrast, the $3^{rd}$ cell C3 may include no gate structures, and thus, may be referred to as a non-CPP cell.

Referring to FIGS. 1A and 1B, the $1^{st}$ cell C1 may include a $1^{st}$ area A1 in which a $1^{st}$ source/drain structure SD1 is connected to a BSPDN structure including a backside contact structure BC1 and a $1^{st}$ backside metal line BM11 formed in a backside isolation structure 110. Further, the $1^{st}$ source/drain structure SD1 may be connected to a $1^{st}$ BEOL metal line M11 through a $1^{st}$ frontside contact structure CA1 and a $1^{st}$ MOL via structure V1 formed in an isolation structure 115.

Thus, according to an embodiment, a backside to frontside connection structure for the semiconductor device 10 in the $1^{st}$ area A1 may be formed by the backside contact structure BC1, the $1^{st}$ source/drain structure, the $1^{st}$ frontside contact structure CA1 and the $1^{st}$ MOL via structure V1.

As the $1^{st}$ source/drain structure SD1, provided to form a field-effect transistor, is used as a conducting path between a back side and a front side of the semiconductor device 10 in the $1^{st}$ area A1, the field-effect transistor structure formed by the $1^{st}$ source/drain structure SD1 and a $2^{nd}$ source/drain structure SD1 connected to the $1^{st}$ source/drain structure SD though a $1^{st}$ channel structure CH1 may be controlled to be nonoperational or not powered, according to an embodiment. However, this field-effect transistor structure may be operational or powered as a field-effect transistor by disabling a connection of the $1^{st}$ source/drain structure SD1 to another circuit element through the $1^{st}$ backside metal line BM11 or the $1^{st}$ BEOL metal line M11, according to an embodiment.

However, no matter how the $1^{st}$ source/drain structure SD1 is used in the semiconductor device 10, the BSPDN structure including the $1^{st}$ backside contact structure BC1 and the $1^{st}$ backside metal line BM11 may be formed at the back side of the semiconductor device 10 considering that the $1^{st}$ area A1 including the $1^{st}$ source/drain structure SD1 is a small-CPP area where the front side of the semiconductor device 10 is more congested than a large-CPP area or a non-CPP area, thereby achieving an area gain and an improved device performance.

Referring to FIGS. 1A and 1C, the $2^{nd}$ cell C2 may include a $2^{nd}$ area A2 in which the back side and the front side of the semiconductor device 10 are connected to each other through a pair of a high-aspect-ratio via structure and a low-aspect-ratio via structure, for example, a $1^{st}$ frontside via structure SV1 and a $2^{nd}$ MOL via structure V2 formed on the $1^{st}$ frontside via structure SV1.

According to an embodiment, the $1^{st}$ frontside via structure SV1 may be connected to a $2^{nd}$ backside metal line BM12 in the backside isolation structure 110, and connected to a $2^{nd}$ BEOL metal line M12 though the $2^{nd}$ MOL via structure V2. Thus, the $1^{st}$ frontside via structure SV1 and the $2^{nd}$ MOL via structure V2 may form a backside to frontside connection structure in the $2^{nd}$ area A2 of the semiconductor device 10, according to an embodiment.

As shown in FIG. 1C, the $1^{st}$ frontside via structure SV1 may have a height H1 which is greater than a height H2 of the $2^{nd}$ MOL via structure V2 and the $1^{st}$ MOL via structure V1 (FIG. 1B) although they may have an equal or substantially equal width. Thus, the $1^{st}$ frontside via structure SV1 is referred to as a high-aspect-ratio via structure, and the $1^{st}$ MOL via structure V1 is referred to as a low-aspect-ratio via structure. The frontside via structure SV1 may also be referred to as a front via backside power rail (FVBP) structure.

According to an embodiment, the $2^{nd}$ area A2 may allow formation of the $1^{st}$ frontside via structure SV1 having a high aspect ratio to connect the back side to the front side of the semiconductor device 10, while the $1^{st}$ area A1 may not allow the formation of the $1^{st}$ frontside via structure SV1 for the same purpose. This is because the $2^{nd}$ area A2 included in the $2^{nd}$ cell may have a relatively large space and less congested to accommodate formation of a deep via structure, compared to the $1^{st}$ area A1, due to the larger CPP.

However, the $1^{st}$ area A1 shown in FIGS. 1A and 1B implements the backside to frontside connection structure without using the $1^{st}$ frontside via structure SV1 at a side of and distant from the $3^{rd}$ source/drain structure SD3 as shown in FIG. 1C. Thus, the $1^{st}$ area A1 may achieve an area gain over the $2^{nd}$ area A2. Further, as the backside to frontside connection structure in the $1^{st}$ area A1 does not use a high-aspect-ratio via structure such as the $1^{st}$ frontside via structure, manufacturing simplicity may also be achieved in the $1^{st}$ area A1.

FIG. 1A shows that the $2^{nd}$ area A2 is included in the $2^{nd}$ cell C2 (large-CPP cell) having a large gate pitch and a large gate length. Thus, the $2^{nd}$ area A2 may be referred to as a large-CPP area while the $1^{st}$ area A1 included in the $1^{st}$ cell C1 (small-CPP cell) may be referred to as a small-CPP area. Further, the $2^{nd}$ area A2 may be characterized in that the $2^{nd}$ channel structure CH2 connected to the $3^{rd}$ source/drain structure SD3 has a channel length L2 which is greater than a channel length L1 of the $1^{st}$ channel structure CH1 in the $1^{st}$ area A1 of the $1^{st}$ cell C1.

According to an embodiment, the $1^{st}$ frontside via structure SV1 may also be connected to a $2^{nd}$ frontside contact structure CA2 formed on the $3^{rd}$ source/drain structure SD3, in order to connect the $3^{rd}$ source/drain structure SD3 to either the $2^{nd}$ BEOL metal line M12 or the $2^{nd}$ backside metal line BM12 so that a field-effect transistor formed from the $3^{rd}$ source/drain structure SD3 and a $4^{th}$ source/drain structure SD4 may be operational or powered.

As the BSPDN structure including the $2^{nd}$ backside metal line BM12 may also be used at the back side of the $2^{nd}$ cell C2 including the $2^{nd}$ area A2 (large-CPP area) according to the present embodiment, an additional area gain for the semiconductor device 10 may be achieved. Further, simultaneously, the BSPDN structure originally intended and provided for the $1^{st}$ cell C1 including the $1^{st}$ area A1 (small-CPP area) may be more effectively used in the semiconductor device 10.

The BSPDN structure may also be used in the $3^{rd}$ cell C3, which is a non-CPP cell, according to an embodiment.

Referring to FIGS. 1A and 1D, a 3$^{rd}$ area A3 in the 3$^{rd}$ cell C3 may include a plurality of frontside via structures and a plurality of MOL via structures formed thereon respectively. For example, a 2$^{nd}$ frontside via structure SV2 and a 3$^{rd}$ MOL via structure V3 formed thereon may connect a 3$^{rd}$ backside metal line BM13 formed in the backside isolation structure 110 to a 3$^{rd}$ BEOL metal line M13.

As the 3$^{rd}$ cell including the 3$^{rd}$ area A3 is free of a gate structure, device density may be less required in the semiconductor device 10, and thus, formation of the plurality of frontside via structures having a high aspect ratio connected to respective backside metal lines may be facilitated.

As the BSPDN structure formed at the back side of the 1$^{st}$ cell C1 including the 1$^{st}$ area A1 (small-CPP area) is extended to the back side of the 3$^{rd}$ cell C3 including the 3$^{rd}$ area A3 (non-CPP area) as well as the 2$^{nd}$ cell C2 including the 2$^{nd}$ area A2 (large-CPP area), more effective use of the BSPDN structure may be achieved.

In the above embodiments, the large-CPP area and the large-CPP cell are characterized by the large gate pitch, a large gate size (e.g., length), and a long channel structure. However, the large-CPP area may have a large metal line pitch or an interconnect pitch between the BEOL metal lines.

In the above embodiments, the 2$^{nd}$ area A2, which is a large-CPP area, is included in the 2$^{nd}$ cell C2, which is a large-CPP cell, as shown in FIG. 1A. However, according to an embodiment, the 2$^{nd}$ cell C2 as well as the 1$^{st}$ cell C1 may be differently configured such that the fin-cut structure B2 as a cell boundary currently formed between the 3$^{rd}$ gate structure G3 and the 4$^{th}$ gate structure is formed between the 4$^{th}$ gate structure G4 and the 5$^{th}$ gate structure G5. In this cell configuration, the 2$^{nd}$ area A2 (large-CPP area) may be included in the 1$^{st}$ cell C1 (small-CPP cell). Thus, the 1$^{st}$ cell C1 may include both the 1$^{st}$ area A1 (small-CPP area) and the 2$^{nd}$ area A2 (large-CPP area) which has the long channel structure CH2 and the large-sized gate structure G4 having a large gate pitch P2.

Further, the 2$^{nd}$ area A2 as a large-CPP area may also include an area at a side of a boundary (e.g., boundary B2) of a cell whether it is a large-CPP cell or a small-CPP cell because this area may provide a large space for formation of a frontside via structure to connect a back side to a front side in a semiconductor device.

Similarly, the non-CPP area, that is, the 3$^{rd}$ area A3 may be included in a small-CPP cell like the 1$^{st}$ cell C1, according to an embodiment.

Thus, even when the 2$^{nd}$ area A2 and the 3$^{rd}$ area A3 shown in FIG. 1A is included in the 1$^{st}$ cell C1, these areas A2 and A3 may be supported by the BSPDN structure which may be extended from the back side of the 1$^{st}$ area A1 to achieve an additional area gain at the front side of the semiconductor device 10 and an improved device performance.

FIG. 1A shows that only three cells are included in the semiconductor device 10. However, the above embodiments about a BSPDN structure at a back side of each of a small-CPP area, a large-CPP area and a non-CPP area may also apply to a semiconductor device in which one or more cells are added to the three cells C1-C3 in at least one of a 1$^{st}$ direction D1 and a 2$^{nd}$ direction D2, according to embodiments. Further, FIG. 1A shows that the three cells C1-C3 are arranged in the 2$^{nd}$ direction D2 one after another in the semiconductor device 10. However, the above embodiments may also apply to a semiconductor device in which the three cells C1-C3 may be separated from one another with at least one another cell therebetween. Moreover, FIG. 1A shows that the semiconductor device 10 have five gate structures and three active regions. However, the above embodiments may apply to a semiconductor device in which more or less than five gate structures and three active regions are formed.

Formation of a BSPDN structure at a back side of a small-CPP area and a large-CPP area may also apply to a semiconductor device including three-dimensional-stacked field-effect transistor (3DSFET) structures.

Figure 2B:
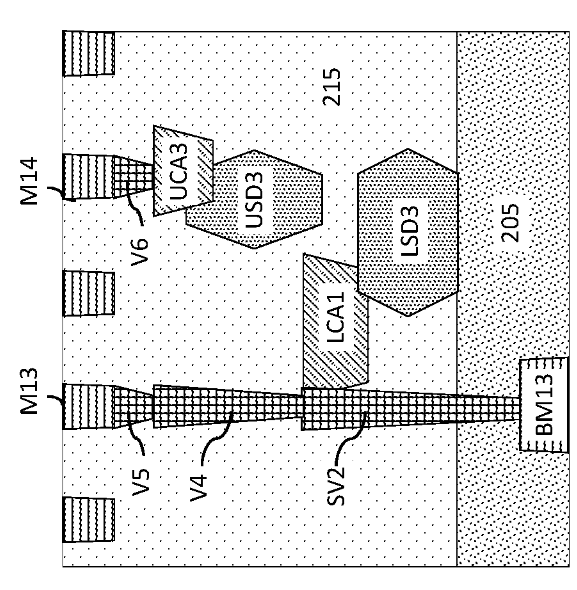
FIGS. 2A and 2B illustrate a semiconductor device in which a BSPDN structure is formed at a back side of a small-CPP area and a large-CPP area including 3DSFET structures, according to embodiments.
Figure 2A:
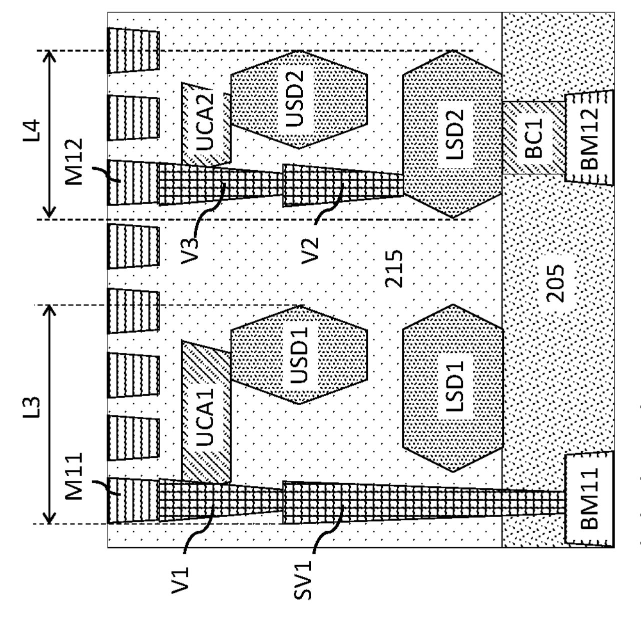

FIGS. 2A and 2B illustrate a semiconductor device in which a BSPDN structure is formed at a back side of a small-CPP area and a large-CPP area including 3DSFET structures, according to embodiments.

FIG. 2A shows a 1$^{st}$ area A1 of a semiconductor device 20, which is a small-CPP area, which may include a 1$^{st}$ 3DSFET structure 210 and a 2$^{nd}$ 3DSFET structure 220 formed in an isolation structure 215.

The 1$^{st}$ 3DSFET structure 210 may include a 1$^{st}$ lower source/drain structure LSD1 and a 1$^{st}$ upper source/drain structure USD1 formed above the 1$^{st}$ lower source/drain structure LSD1. The 1$^{st}$ lower source/drain structure LSD1 may form a lower field-effect transistor along with another source/drain structure and a lower channel structure surrounded by a lower gate structure (not shown). The 1$^{st}$ upper source/drain structure USD1 may form an upper field-effect transistor along with another upper source/drain structure and an upper channel structure surrounded by an upper gate structure (not shown).

Similar to the 1$^{st}$ 3DSFET structure 210, the 2$^{nd}$ 3DSFET structure 220 may include a 2$^{nd}$ lower source/drain structure LSD2 and a 2$^{nd}$ upper source/drain structure USD2 formed above the 2$^{nd}$ lower source/drain structure LSD2. The 2$^{nd}$ lower source/drain structure LSD2 may form a lower field-effect transistor along with another source/drain structure and a lower channel structure surrounded by a lower gate structure (not shown). The 2$^{nd}$ upper source/drain structure USD2 may form an upper field-effect transistor along with another upper source/drain structure and an upper channel structure surrounded by an upper gate structure (not shown).

According to an embodiment, the 1$^{st}$ area A1 (small-CPP area) of the semiconductor device 20 may also include a 1$^{st}$ backside to frontside connection structure 211 formed of a 1$^{st}$ frontside via structure SV1 and a 1$^{st}$ MOL via structure V1 on the 1$^{st}$ frontside via structure SV1. The 1$^{st}$ backside to frontside connection structure 211 may be formed at a side of and distant from the 1$^{st}$ 3DSFET structure 210, without directly contacting the 1$^{st}$ 3DSFET structure 210, and extended to an inside of a backside isolation structure 205 to connect a 1$^{st}$ backside metal line B11 formed therein to a 1$^{st}$ BEOL metal line M11.

The 1$^{st}$ MOL via structure V1 may be connected to a 1$^{st}$ upper contact structure UCA1 to connect the 1$^{st}$ upper source/drain structure USD1 of the 1$^{st}$ 3DSFET structure 210 to another circuit element or a voltage source through the 1$^{st}$ backside metal line BM11 or the 1$^{st}$ BEOL metal line M11 so that the upper field-effect transistor of the 1$^{st}$ 3DSFET structure 210 may be operational or powered. However, when the 1$^{st}$ backside to frontside connection structure 211 is to be operational to connect the 1$^{st}$ backside metal line BM11 to the 1$^{st}$ BEOL metal line M11, another element of the 1$^{st}$ 3DSFET structure 210 may be controlled to be nonoperational or not powered, according to an embodiment.

According to an embodiment, the 1$^{st}$ area A1 of the semiconductor device 20 may also include a 2$^{nd}$ backside to frontside connection structure 221 formed of a backside contact structure BC1, the 2$^{nd}$ lower source/drain structure LSD2, a 2$^{nd}$ MOL via structure V2 and a 3$^{rd}$ MOL via structure V3. According to an embodiment, the backside contact structure BC1 formed on a $2^{nd}$ backside metal line BM12 may be connected to a bottom surface of the $2^{nd}$ lower source/drain structure LSD2, and the $2^{nd}$ MOL via structure V2 may be formed on a top surface (and/or a side surface) of the $2^{nd}$ lower source/drain structure LSD2. The $3^{rd}$ MOL via structure V3 may be formed between the $1^{st}$ MOL via structure V1 and a $2^{nd}$ BEOL metal line M12.

The $3^{rd}$ MOL via structure V3 may be connected to a $2^{nd}$ upper contact structure UCA2 to connect the $2^{nd}$ upper source/drain structure of the $2^{nd}$ 3DSFET structure 220 to another circuit element or a voltage source through the $2^{nd}$ backside metal line BM12 or the $2^{nd}$ BEOL metal line M12 so that the upper field-effect transistor of the $2^{nd}$ 3DSFET structure 210 may be operational or powered. However, when the $2^{nd}$ backside to frontside connection structure 221 is to be operational to connect the $2^{nd}$ backside metal line BM12 to the $2^{nd}$ BEOL metal line M12, another element of the $2^{nd}$ 3DSFET structure 220 may be controlled to be nonoperational or not powered, according to an embodiment.

It is understood here that the $1^{st}$ area A1, which is a small-CPP area, of the semiconductor device 20 accommodates the $1^{st}$ backside to frontside connection structure 211 including the $1^{st}$ frontside via structure SV1 having a high aspect ratio in addition to the $2^{nd}$ backside to frontside connection structure 221 using the MOL via structures V1 and V2 having a low aspect ratio, according to an embodiment.

However, the $2^{nd}$ backside to frontside connection structure 221 along with the $2^{nd}$ 3DSFET structure 220 may occupy a smaller space having a smaller length L4 than the $1^{st}$ backside to frontside connection structure 211 along with the $1^{st}$ 3DSFETs 210 having a greater length L3 because the $2^{nd}$ lower source/drain structure LSD2 is used as a part of the $2^{nd}$ backside to frontside connection structure 221 as described above.

FIG. 2B shows a $2^{nd}$ area A2 of the semiconductor device 20, which is a large-CPP area which may include a $3^{rd}$ 3DSFET structure 230.

Similar to the $1^{st}$ and $2^{nd}$ 3DSFET structures 210 and 220, the $3^{rd}$ 3DSFET structure 230 may include a $3^{rd}$ lower source/drain structure LSD3 and a $3^{rd}$ upper source/drain structure USD3 formed above the $3^{rd}$ lower source/drain structure LSD3. The $3^{rd}$ lower source/drain structure LSD3 may also form a lower field-effect transistor along with another source/drain structure and a lower channel structure surrounded by a lower gate structure (not shown). The $3^{rd}$ upper source/drain structure USD3 may also form an upper field-effect transistor along with another upper source/drain structure and an upper channel structure surrounded by an upper gate structure (not shown).

According to an embodiment, the $2^{nd}$ area A2 (large-CPP area) of the semiconductor device 20 may also include a $3^{rd}$ backside to frontside connection structure 231 formed of a $2^{nd}$ frontside via structure SV2, a $4^{th}$ MOL via structure V4 on the $2^{nd}$ frontside via structure SV2, and a $5^{th}$ MOL via structure V5 on the $4^{th}$ MOL via structures V4. The $3^{rd}$ backside to frontside connection structure 231 may be formed at a side of and distant from the $3^{rd}$ 3DSFET structure 230, without directly contacting the $1^{st}$ 3DSFET structure 210, and extended to an inside of the backside isolation structure 205 to connect a $3^{rd}$ backside metal line B31 formed therein to a $3^{rd}$ BEOL metal line M13.

The $2^{nd}$ frontside via structure SV2 may be connected to a $1^{st}$ lower contact structure LCA1 to connect the $3^{rd}$ lower source/drain structure LSD3 of the $1^{st}$ 3DSFET structure 210 to another circuit element or a voltage source through the $3^{rd}$ backside metal line BM13 or the $3^{rd}$ BEOL metal line M13 so that the lower field-effect transistor of the $3^{rd}$ 3DSFET structure 230 may be operational or powered. A $6^{th}$ MOL via structure V6 may be connected to a $3^{rd}$ upper contact structure UCA3 to connect the $3^{rd}$ upper source/drain structure USD3 to another circuit element or a voltage source through a $4^{th}$ BEOL metal line M14 so that the upper field-effect transistor of the $3^{rd}$ 3DSFET structure 230 may be operational or powered.

However, when the $3^{rd}$ backside to frontside connection structure 231 is to be operational to connect the $3^{rd}$ backside metal line BM13 to the $3^{rd}$ BEOL metal line M13, another element of the $3^{rd}$ 3DSFET structure 230 may be controlled to be nonoperational or not powered, according to an embodiment.

It is understood here that the $2^{nd}$ area A2, which is a large-CPP area, of the semiconductor device 20 may facilitate formation of the $3^{rd}$ backside to frontside connection structure 211 including the $2^{nd}$ frontside via structure SV2 having a high aspect ratio. However, as a BSPDN structure including the backside contact structure BC1 and the backside metal lines BM11 and BM12 in the $1^{st}$ area A1 (small-CPP area) may be extended to a back side of the $2^{nd}$ area A2 (large-CPP area), an additional area gain may be achieved for the semiconductor device 20.

In the above embodiments, the back side of the $1^{st}$ semiconductor device 10 and the $2^{nd}$ semiconductor device 20 is formed of the backside isolation structures 105 and 205, respectively, which may have replaced a substrate formed of silicon, germanium or its combination. The isolation structures 105, 115, 205 and 215 may each be formed of a dielectric material such as silicon oxide (SiO, $SiO_2$, etc.), not being limited thereto. However, according to an embodiment, at least a part of the back side of the $1^{st}$ semiconductor device 10 and the $2^{nd}$ semiconductor device 20 may include the substrate when the backside isolation structure 105 and 205 does not replace the substrate in its entirety.

In the above embodiments, the via structures SV1, SV2, V1-V6 and the metal lines BM11-BM13 and M11-M14 may each be formed of a metal or a metal compound including copper (Cu), aluminum (Al), tungsten (W), molybdenum (Mo), ruthenium (Ru), cobalt (Co), etc.

In the above embodiments, the field-effect transistor structures of the semiconductor device 10 and the 3DSFET structures of the semiconductor device 20 may each be formed of at least one of a fin field-effect transistor, a nanosheet transistor, or the like, not being limited thereto. The FinFET structure has one or more horizontally arranged vertical fin structures as a channel structure of which at least three surfaces are surrounded by a gate structure, and the nanosheet transistor structure is characterized by one or more nanosheet channel layers vertically stacked on a substrate as a channel structure, and a gate structure surrounding all four surfaces of each of the nanosheet channel layers. The nanosheet transistor is referred to as gate-all-around (GAA) transistor, multi-bridge channel field-effect transistor (MBCFET).

Figure 3:
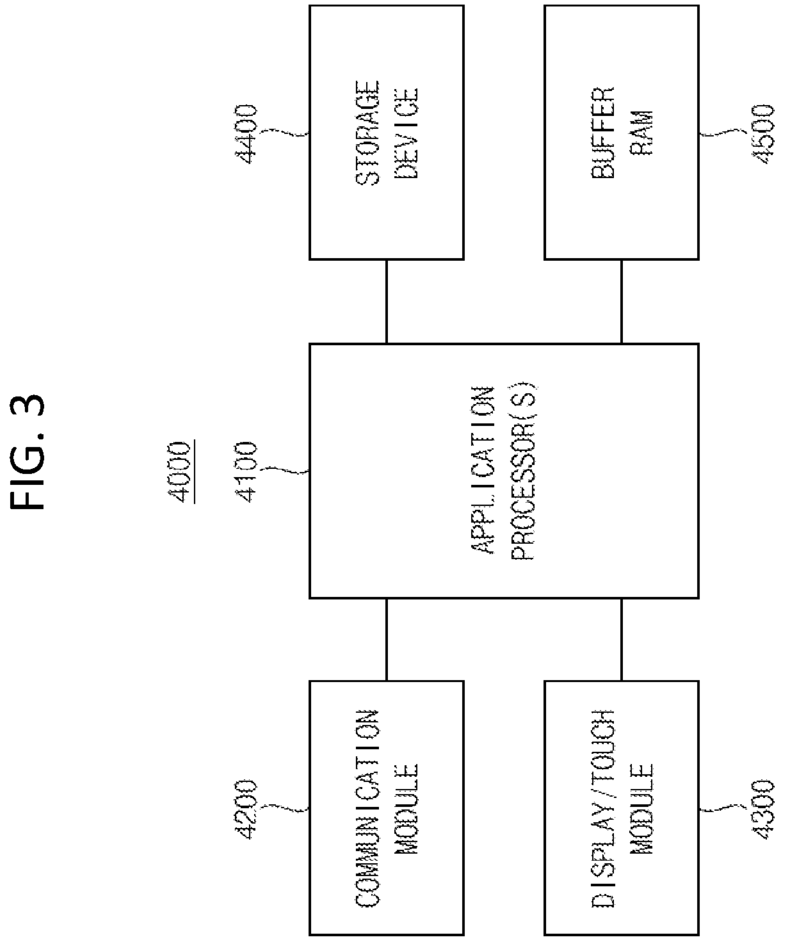
FIG. 3 is a schematic block diagram illustrating an electronic device including a semiconductor device or a portion thereof described in reference to FIGS. 1A-1D, 2A and 2B, according to an embodiment.

FIG. 3 is a schematic block diagram illustrating an electronic device including at least one of the semiconductor device 10 and the semiconductor device 20 or a portion thereof, as described above in reference to FIGS. 1A-1D, 2A and 2B, according to an embodiment.

Referring to FIG. 3, an electronic device 4000 may include at least one application processor 4100, a communication module 4200, a display/touch module 4300, a storage device 4400, and a buffer random access memory (RAM) 4500. The electronic device 4000 may be a mobile device such as a smartphone or a tablet computer, not being limited thereto, according to embodiments.

The application processor 4100 may control operations of the electronic device 4000. The communication module 4200 is implemented to perform wireless or wire communications with an external device. The display/touch module 4300 is implemented to display data processed by the application processor 4100 and/or to receive data through a touch panel. The storage device 4400 is implemented to store user data. The storage device 4400 may be an embedded multimedia card (eMMC), a solid state drive (SSD), a universal flash storage (UFS) device, etc. The storage device 4400 may perform caching of the mapping data and the user data as described above.

The buffer RAM 4500 may temporarily store data used for processing operations of the electronic device 4000. For example, the buffer RAM 4500 may be volatile memory such as double data rate (DDR) synchronous dynamic random access memory (SDRAM), low power double data rate (LPDDR) SDRAM, graphics double data rate (GDDR) SDRAM, Rambus dynamic random access memory (RDRAM), etc.

The electronic device 4000 may further include at least one sensor such as an image sensor.

At least one component in the electronic device 4000 may include the semiconductor device 10 or the semiconductor device 20 or a portion thereof described above in reference to FIGS. 1A-1D, 2A and 2B.

The foregoing is illustrative of example embodiments and is not to be construed as limiting the disclosure. Although some example embodiments have been described above, those skilled in the art will readily appreciate that many modifications are possible in the above embodiments without materially departing from the disclosure.

What is claimed is:

1. A semiconductor device comprising:
- a $1^{st}$ source/drain structure;
- a $2^{nd}$ source/drain structure;
- a $1^{st}$ frontside contact structure, at a front side of the semiconductor device, connected to the $1^{st}$ source/drain structure;
- a $1^{st}$ via structure on the $1^{st}$ frontside contact structure;
- a $2^{nd}$ via structure, at a lateral side of the $2^{nd}$ source/drain structure;
- a $3^{rd}$ via structure on the $2^{nd}$ via structure;
- a $2^{nd}$ frontside contact structure, at the front side of the semiconductor device, connected to the $2^{nd}$ source/drain structure and the $2^{nd}$ via structure;
- a $1^{st}$ frontside metal line, at the front side of the semiconductor device, connected to the $1^{st}$ via structure;
- a $1^{st}$ backside contact structure, at a back side of the semiconductor device, connected to the $1^{st}$ source/drain structure; and
- a $1^{st}$ backside metal line, at the back side of the semiconductor device, connected to the $1^{st}$ backside contact structure.

2. The semiconductor device of claim 1, wherein the $1^{st}$ backside contact structure is formed in a backside isolation structure.

3. The semiconductor device of claim 1, further comprising:
- a $2^{nd}$ frontside metal line, at the front side of the semiconductor device, connected to the $3^{rd}$ via structure; and
- a $2^{nd}$ backside metal line, at the back side of the semiconductor device, connected to the $2^{nd}$ via structure.

4. The semiconductor device of claim 3, wherein the $2^{nd}$ backside metal line is formed in a backside isolation structure, and
- wherein the $2^{nd}$ via structure is connected to the $2^{nd}$ backside metal line in an inside of the backside isolation structure.

5. The semiconductor device of claim 3, wherein the $2^{nd}$ via structure has a greater aspect ratio than the $1^{st}$ via structure.

6. The semiconductor device of claim 3, wherein an aspect ratio of the $2^{nd}$ via structure is greater than an aspect ratio of each of the $1^{st}$ via structure and the $3^{rd}$ via structure.

7. The semiconductor device of claim 3, further comprising:
- a $4^{th}$ via structure;
- a $5^{th}$ via structure on the $4^{th}$ via structure;
- a $3^{rd}$ frontside metal line, at the front side of the semiconductor device, connected to the $5^{th}$ via structure; and
- a $3^{rd}$ backside metal line, at the back side of the semiconductor device, connected to the $4^{th}$ via structure.

8. The semiconductor device of claim 7, wherein the $3^{rd}$ backside metal line is formed in a substrate or a backside isolation structure, and
- wherein the $4^{th}$ via structure is connected to the $3^{rd}$ backside metal line in an inside of the substrate or the backside isolation structure.

9. The semiconductor device of claim 7, wherein an aspect ratio of the $4^{th}$ via structure is equal to the aspect ratio of the $2^{nd}$ via structure and greater than an aspect ratio of each of the $3^{rd}$ via structure and the $5^{th}$ via structure.

10. The semiconductor device of claim 3, further comprising:
- a $1^{st}$ gate structure adjacent to the $1^{st}$ source/drain structure; and
- a $2^{nd}$ gate structure adjacent to the $2^{nd}$ source/drain structure,
- wherein a gate pitch between a plurality of gate structures comprising the $2^{nd}$ gate structure is greater than a gate pitch between a plurality of gate structures comprising the $1^{st}$ gate structure.

11. The semiconductor device of claim 3, further comprising:
- a $1^{st}$ gate structure adjacent to the $1^{st}$ source/drain structure; and
- a $2^{nd}$ gate structure adjacent to the $2^{nd}$ source/drain structure,
- wherein the $2^{nd}$ gate structure has a greater gate length than the $1^{st}$ gate structure in a channel-length direction.

12. The semiconductor device of claim 3, further comprising:
- a $1^{st}$ channel structure connected to the $1^{st}$ source/drain structure; and
- a $2^{nd}$ channel structure connected to the $2^{nd}$ source/drain structure,
- wherein the $2^{nd}$ channel structure has a greater length than the $1^{st}$ channel structure.

13. A semiconductor device comprising:
- a $1^{st}$ source/drain structure;
- a $1^{st}$ frontside contact structure, at a front side of the semiconductor device, connected to the $1^{st}$ source/drain structure;
- a $1^{st}$ via structure, at a lateral side of the $1^{st}$ source/drain structure, connected to the $1^{st}$ frontside contact structure;
- a $2^{nd}$ via structure on the $1^{st}$ via structure;

a $1^{st}$ frontside metal line, at the front side of the semiconductor device, connected to the $2^{nd}$ via structure; and a $1^{st}$ backside metal line, at a back side of the semiconductor device, connected to the $1^{st}$ via structure.

14. The semiconductor device of claim 13, wherein the $1^{st}$ backside metal line is formed in a substrate or a backside isolation structure.

15. The semiconductor device of claim 14, wherein the $2^{nd}$ via structure is extended to an inside of the substrate or the backside isolation structure to be connected to the $1^{st}$ backside metal line.

16. The semiconductor device of claim 14, wherein an aspect ratio of the $1^{st}$ via structure is greater than an aspect ratio than the $2^{nd}$ via structure.

17. The semiconductor device of claim 13, wherein the $1^{st}$ source/drain structure is the closest to a boundary of the semiconductor device among a plurality of source/drain structures in the semiconductor device.

18. The semiconductor device of claim 13, further comprising:

a $2^{nd}$ source/drain structure vertically above the $1^{st}$ source/drain structure;

a $2^{nd}$ frontside contact structure, at the front side of the semiconductor device, connected to the $2^{nd}$ source/drain structure;

a $3^{rd}$ via structure on the $2^{nd}$ frontside contact structure; and a $2^{nd}$ frontside metal line, at the front side of the semiconductor device, connected to the $3^{rd}$ via structure.

19. A semiconductor device comprising:

a lower source/drain structure;

an upper source/drain structure above the lower source/drain structure;

an upper contact structure on the upper source/drain structure;

a $1^{st}$ via structure on the $1^{st}$ lower source/drain structure;

a $2^{nd}$ via structure on the $1^{st}$ via structure;

a frontside metal line, at a front side of the semiconductor device, connected to the $2^{nd}$ via structure;

a backside contact structure, at a back side of the semiconductor device, connected to the lower source/drain structure; and a backside metal line, at the back side of the semiconductor device, connected to the backside contact structure, wherein the upper contact structure is connected to the $2^{nd}$ via structure.

20. The semiconductor device of claim 19, wherein the first via structure is at a lateral side of the upper source/drain structure.

* * * * *